(12) United States Patent
Brandl et al.

(10) Patent No.: US 10,604,358 B2
(45) Date of Patent: Mar. 31, 2020

(54) DEVICE, SYSTEM AND METHOD FOR ALIGNING ELECTRONIC COMPONENTS

(71) Applicant: Muehlbauer GmbH & Co. KG, Roding (DE)

(72) Inventors: Franz Brandl, Sattelpeilnstein Gemeide Traitsching (DE); Hans-Peter Monser, Dresden (DE); Sigmund Niklas, Zell (DE)

(73) Assignee: Muehlbauer GmbH & Co. KG, Roding (DE)

( * ) Notice: Subject to any disclaimer, the term of this patent is extended or adjusted under 35 U.S.C. 154(b) by 33 days.

(21) Appl. No.: 16/092,182

(22) PCT Filed: Apr. 7, 2017

(86) PCT No.: PCT/EP2017/058384
§ 371 (c)(1),
(2) Date: Oct. 8, 2018

(87) PCT Pub. No.: WO2017/178364
PCT Pub. Date: Oct. 19, 2017

(65) Prior Publication Data
US 2019/0127155 A1    May 2, 2019

(30) Foreign Application Priority Data

Apr. 14, 2016   (DE) .......................... 10 2016 004 592

(51) Int. Cl.
*H05K 3/30*       (2006.01)
*B65G 47/90*      (2006.01)
(Continued)

(52) U.S. Cl.
CPC .......... *B65G 47/90* (2013.01); *H01L 21/4853* (2013.01); *H01L 21/4867* (2013.01);
(Continued)

(58) Field of Classification Search
CPC ......... H01L 21/67333; H01L 21/67132; H01L 21/67144; H01L 21/4867; H01L 21/6835;
(Continued)

(56) References Cited

U.S. PATENT DOCUMENTS 5,593,917 A * 1/1997 Nuyen ................ H01L 21/6835
                                                    438/107
6,683,416 B1   1/2004 Oohata et al.
(Continued)

FOREIGN PATENT DOCUMENTS

DE   10 2009 020 046 A1   12/2010
EP      2 765 431 A1       8/2014
(Continued)

*Primary Examiner* — Donghai D Nguyen
(74) *Attorney, Agent, or Firm* — John A. Miller; Shumaker, Loop & Kendrick, LLP

(57) ABSTRACT

A system for aligning an electronic component including a substrate having an aligning structure and an aligning device for aligning the electronic component with the aligning structure. The aligning structure defines a first and a second edge, which are at an angle relative to one another and are complementary to two sides of the electronic component to be aligned. The aligning device aligns the electronic component on the aligning structure by bringing sides of the electronic component into contact with both the first edge and also the second edge of the aligning structure. A dispensing unit dispensing the electronic component at a dispensing point by the device for aligning the electronic component close to the aligning structure. A receiving unit receives the electronic component aligned on the aligning structure in the device.

9 Claims, 8 Drawing Sheets

(51) Int. Cl.
*H01L 21/683* (2006.01)
*H01L 21/67* (2006.01)
*H01L 21/673* (2006.01)
*H01L 21/48* (2006.01)
*H01L 23/00* (2006.01)
*H01L 33/62* (2010.01)

(52) U.S. Cl.
CPC .. *H01L 21/67132* (2013.01); *H01L 21/67144* (2013.01); *H01L 21/67333* (2013.01); *H01L 21/6835* (2013.01); *H01L 24/83* (2013.01); *H01L 33/62* (2013.01); *H01L 2221/68309* (2013.01); *H01L 2221/68313* (2013.01); *H01L 2221/68368* (2013.01); *H01L 2221/68381* (2013.01); *H01L 2224/83136* (2013.01); *H01L 2224/83851* (2013.01); *H01L 2924/12041* (2013.01); *H01L 2933/0066* (2013.01)

(58) Field of Classification Search
CPC ............... H01L 21/68; H01L 21/67721; H01L 21/67712; H01L 33/62; Y10T 29/4913; Y10T 29/49133; Y10T 29/5313; Y10T 29/53178
USPC .......................................... 29/832, 834, 740
See application file for complete search history.

(56) References Cited

U.S. PATENT DOCUMENTS

| | | | |
|---|---|---|---|
| 6,887,650 B2 * | 5/2005 | Shimoda | B82Y 10/00 430/311 |
| 7,943,052 B2 * | 5/2011 | Wu | B23K 3/0623 216/20 |
| 8,361,268 B2 | 1/2013 | Mizuno et al. | |
| 2002/0093080 A1 | 7/2002 | Kay | |
| 2006/0154386 A1 | 7/2006 | Cheng et al. | |
| 2011/0043231 A1 | 1/2011 | Richter et al. | |

FOREIGN PATENT DOCUMENTS

| | | |
|---|---|---|
| EP | 2 884 293 A1 | 6/2015 |
| JP | S64 61031 | 3/1989 |
| JP | H05 104 380 | 4/1993 |
| JP | 2006177755 A | 7/2006 |
| KR | 2014 0014441 | 2/2014 |
| WO | 01/33621 A2 | 5/2001 |
| WO | 2010 036304 A2 | 4/2010 |

* cited by examiner

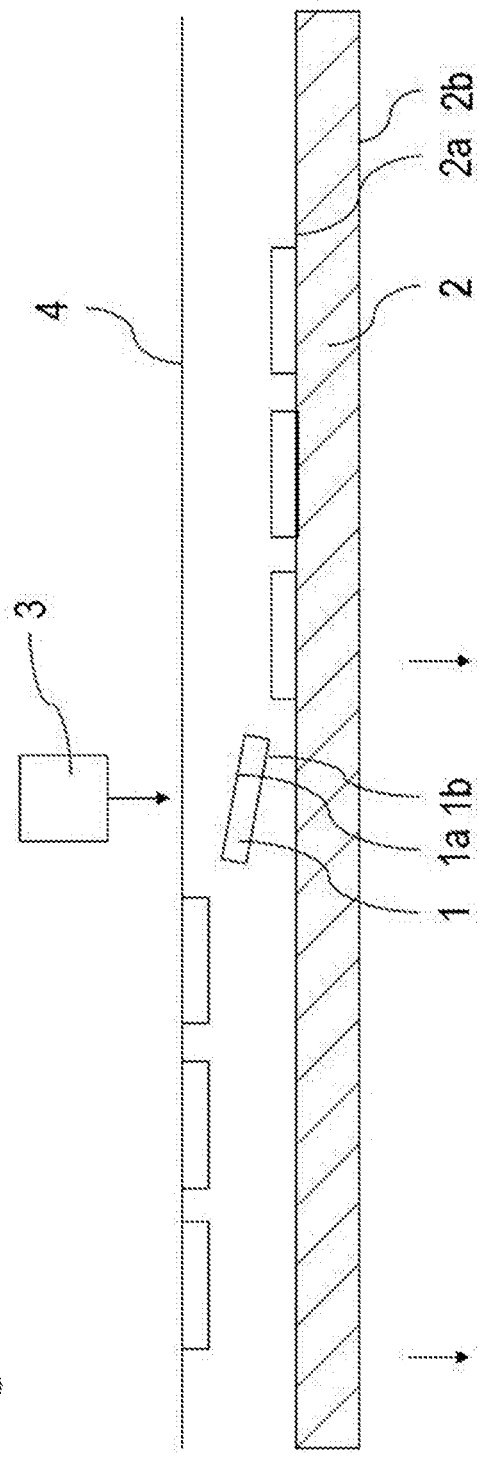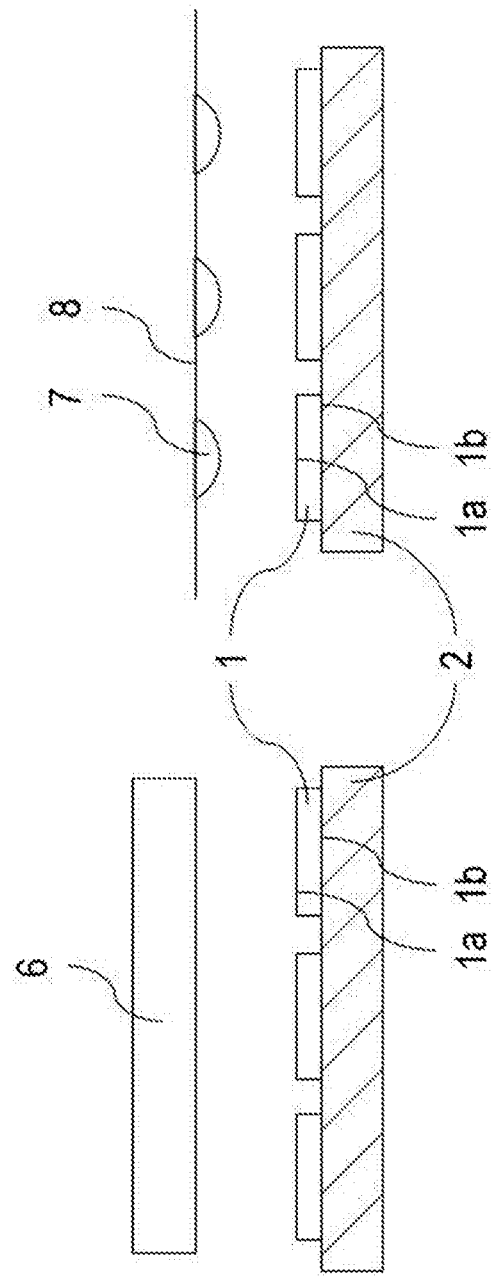

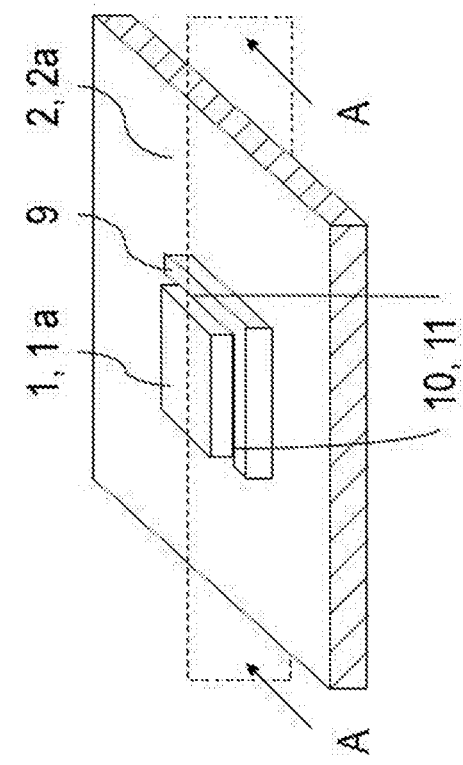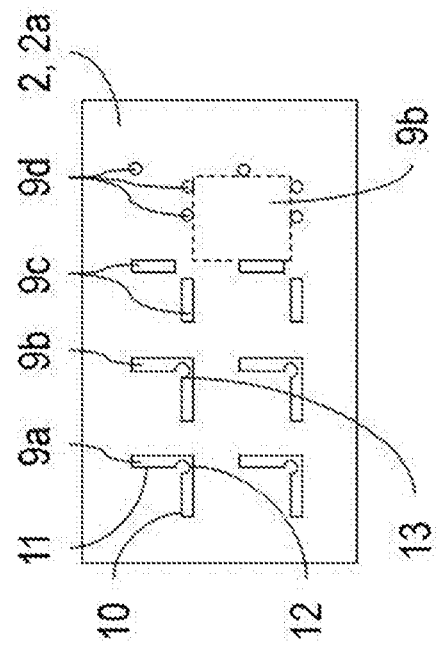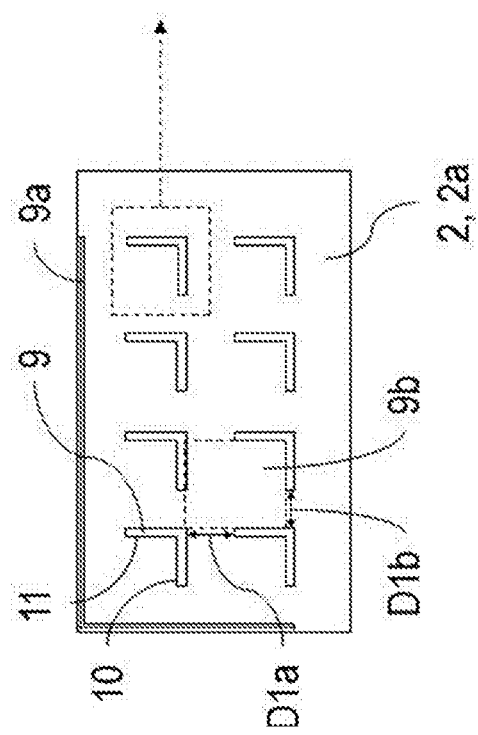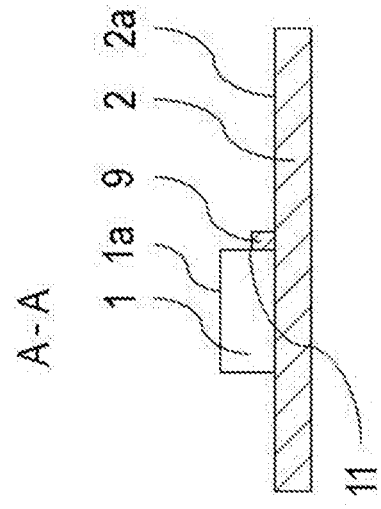

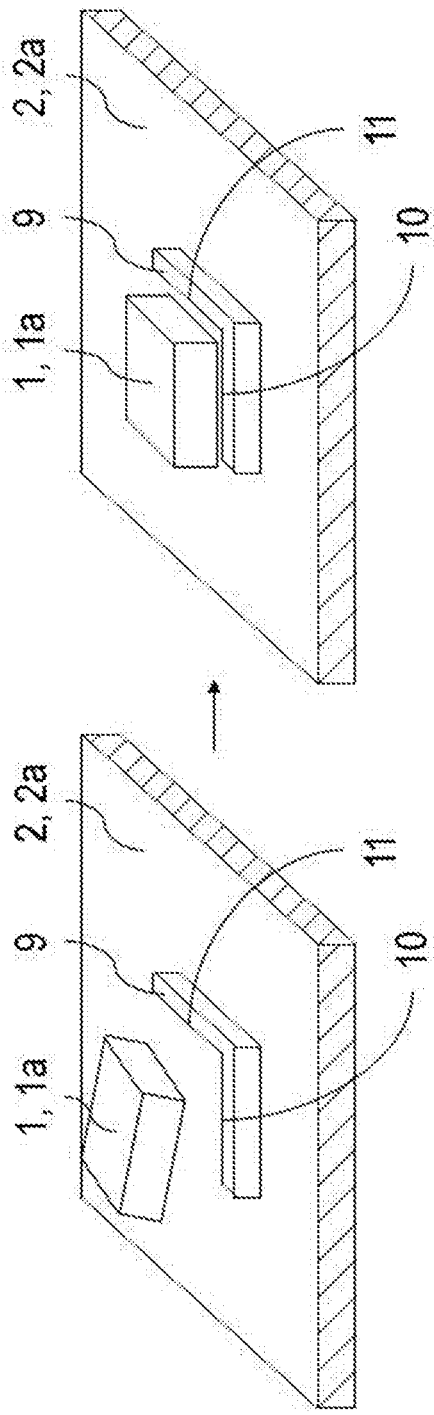
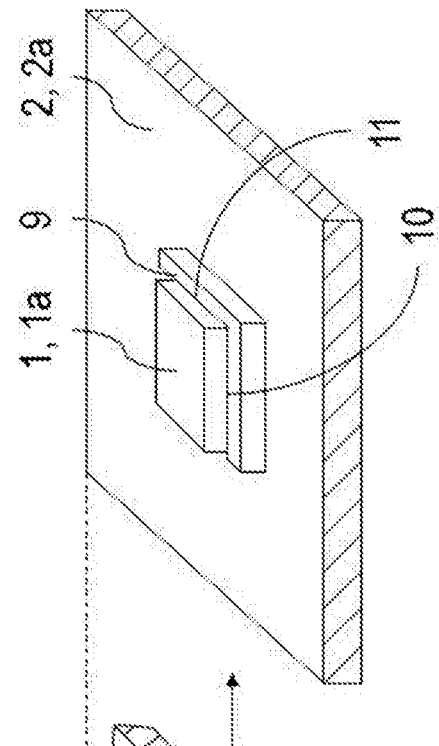
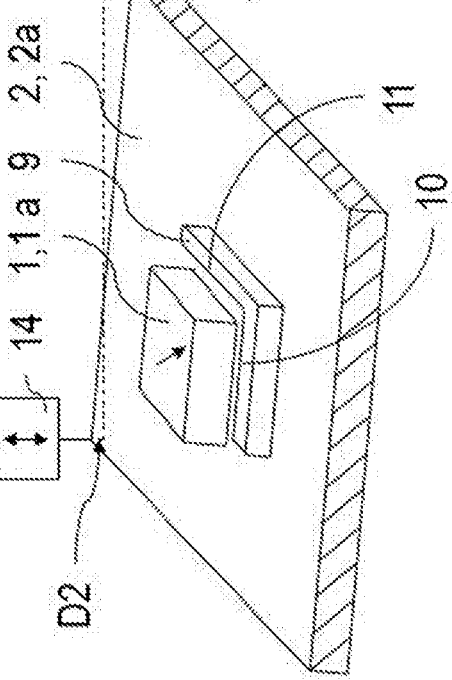

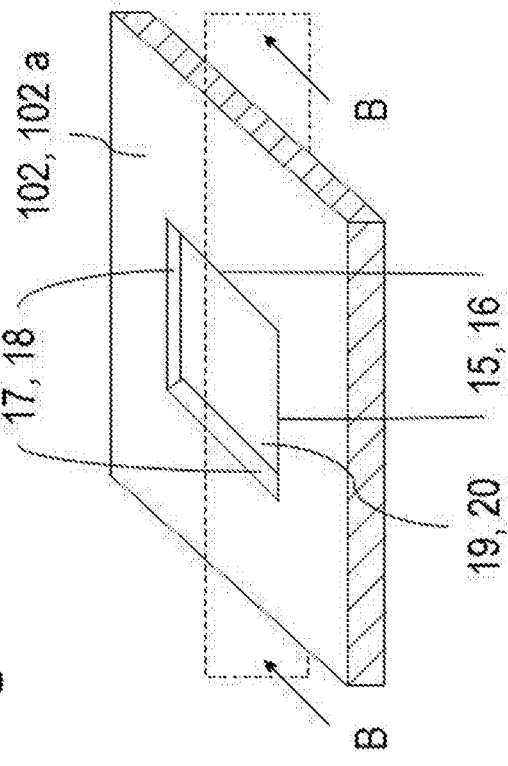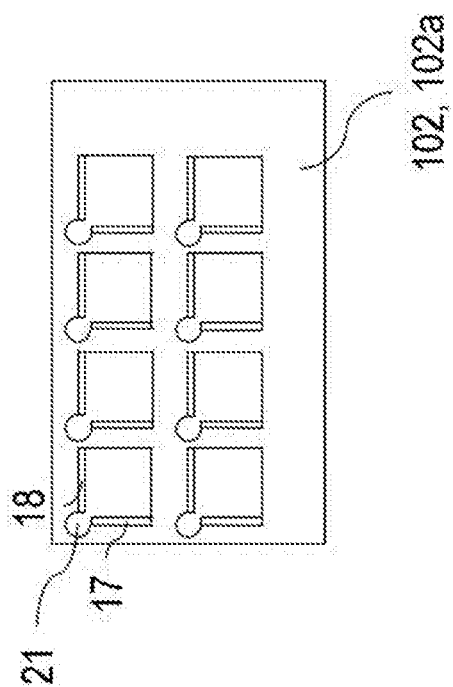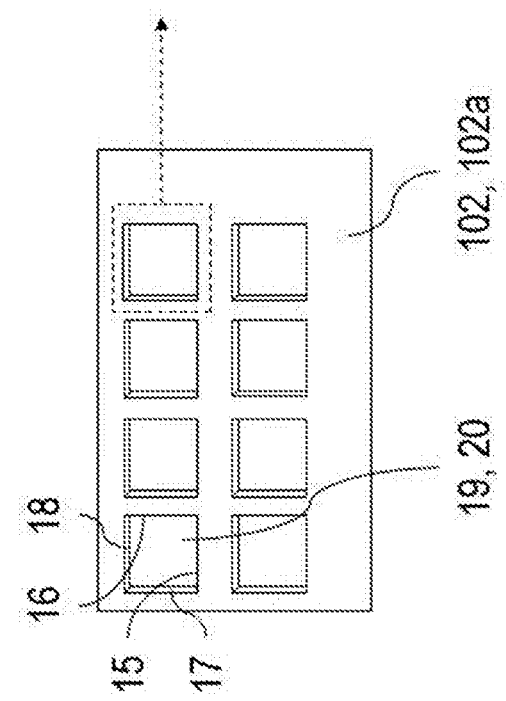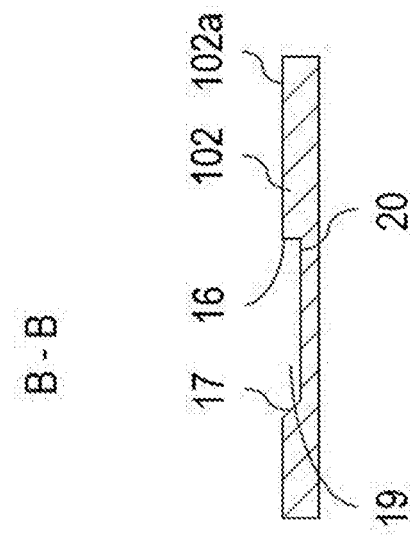

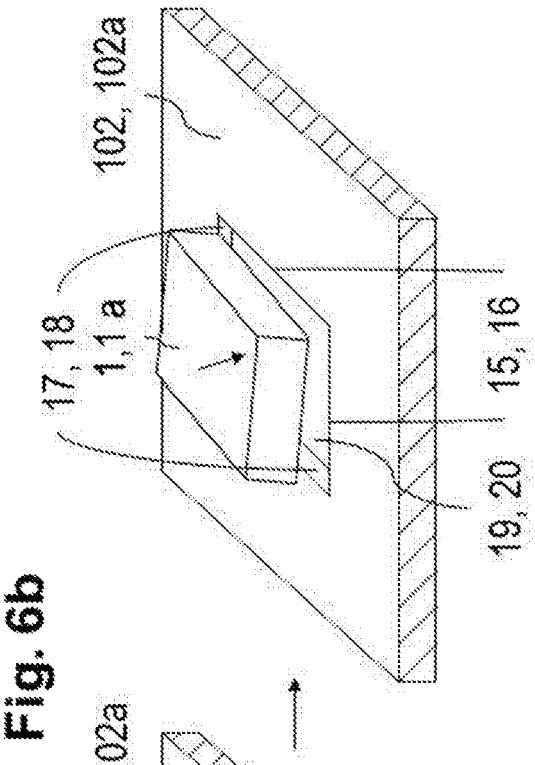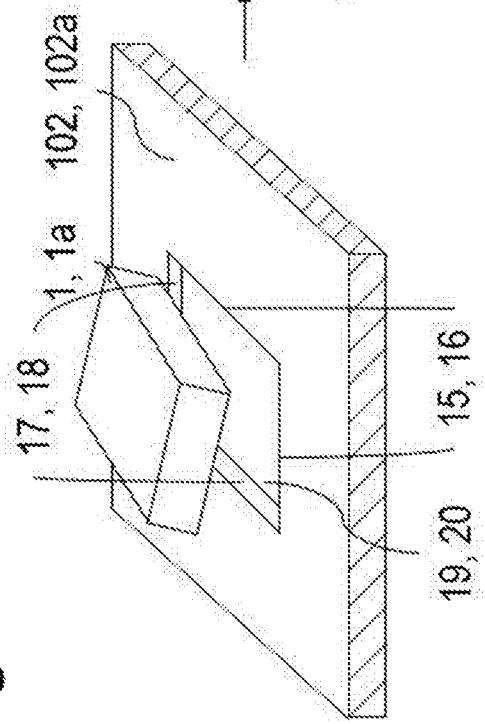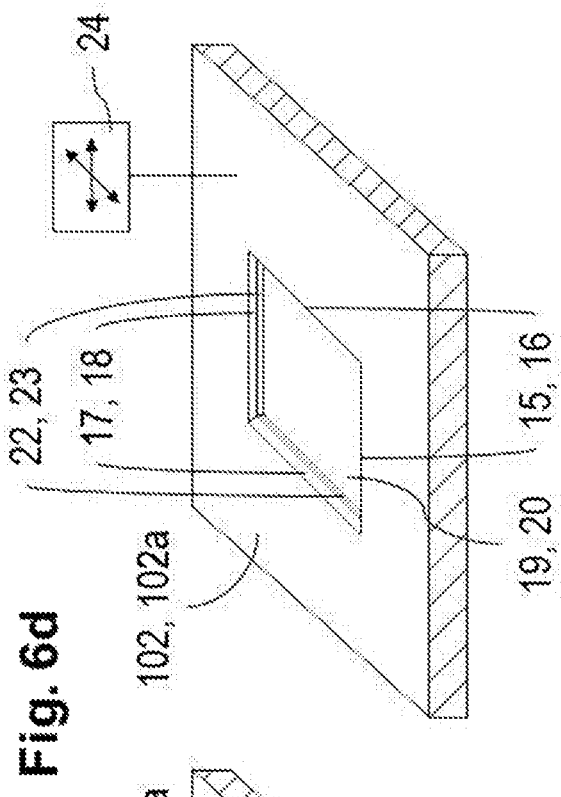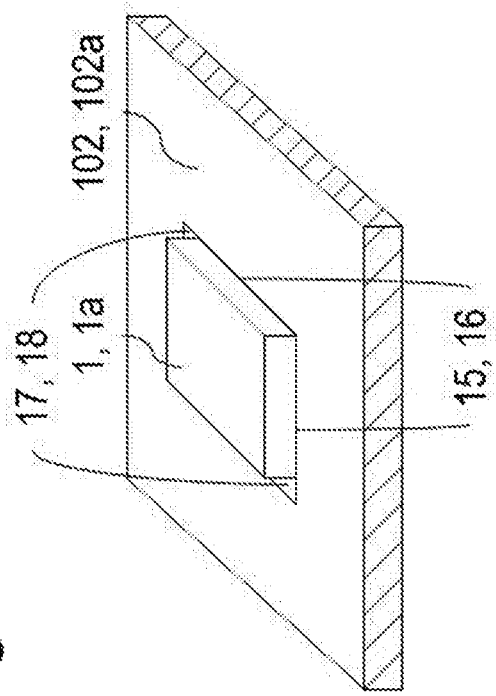

C - C

DEVICE, SYSTEM AND METHOD FOR ALIGNING ELECTRONIC COMPONENTS

CROSS-REFERENCE TO RELATED APPLICATIONS

This application is a National Stage application of International Application No. PCT/EP2017/058384 filed Apr. 7, 2017, which claims priority to German Patent Application Serial No. DE 10 2016 004 592.2, filed Apr. 14, 2016.

BACKGROUND

A device, a system comprising this device, and a method for aligning an electronic component are presented herein. An electronic component is thereby aligned by means of an aligning device with an aligning structure located on a carrier.

US 2010/0258543 A1 discloses a delivery device and a delivery method for electronic components from a wafer by means of a laser. After a free-fall phase, the electronic components thereby delivered land, for example, on a foil substrate.

DE 10 2009 020 540 A1 discloses a device which automatically aligns electronic components which have landed on a foil substrate. For this purpose, a landing zone is provided on the foil substrate for each electronic component. Such a landing zone is formed by a rectangular base area which is enclosed by a peripheral wall, a dish which is open on a side remote from the base area being formed. The dish is filled with an adhesive which, due to surface tension, extends slightly beyond the edge of the wall without leaving the dish. Electronic components which land on the adhesive are automatically arranged and aligned as a result of the effect of the minimization of the free interfacial energy in the region of the adhesive.

WO 2010/036304 A2, on the other hand, discloses a method in which electronic components are delivered from a wafer by means of a laser and, after a free-fall phase, land in pockets/dishes of a component substrate. Here too, adhesive bonding of the landed electronic component with the component substrate is proposed.

U.S. Pat. No. 6,683,416 B1 discloses a method for transferring electronic components from a first substrate to a second substrate. In this method, the substrates are first arranged one above the other so that the electronic components on a surface of the first substrate are facing towards the second substrate. An electronic component is detached from the first substrate by means of a laser and transferred to the second substrate.

Document WO 01/33621 A2 discloses a method and a device for producing recesses in a substrate. The document also discloses a self-aligning method for components which are to be arranged on the substrate with openings, the components sliding along the tilted substrate by means of gravity, for example. In order to improve this method, the document further proposes vibrating the substrate so that a movement of the components on the substrate is promoted.

Further prior art is known from U.S. Pat. No. 8,361,268 B2.

The solution presented relates in particular also to the manufacture of LED color screen display boards, which are composed of a plurality of panels. One panel (rigid or flexible) has, for example, 8 million pixels. One pixel consists of 3 LEDs, namely red, green and blue. That is to say, one panel is to be equipped with 24 million LEDs, which would be very complicated and time-intensive if it were to be equipped sequentially in the known manner.

SUMMARY

The object is to achieve reliable and efficient alignment of an electronic component on a carrier, which is suitable in particular for the temporary alignment of a plurality of electronic components on a carrier.

In order to achieve this object, a device, a system comprising this device and a method having the features of the independent claims are presented herein.

Such a device for aligning an electronic component has a carrier with an aligning structure for an electronic component, and an aligning device for aligning the electronic component with the aligning structure, wherein the aligning structure defines a first and a second edge which are at an angle to one another and are complementary to two sides, which are at the same angle to one another, of the electronic component to be aligned, wherein the aligning device is adapted to align the electronic component with the aligning structure by bringing sides of the electronic component into contact both with the first and with the second edge of the aligning structure. By means of the aligning structure and the aligning device, the device described at the beginning allows one electronic component or also a plurality of electronic components which has/have been deposited only approximately precisely on a carrier to be arranged and aligned precisely. For this purpose, the device is easy and inexpensive to produce.

It is advantageous if the carrier has a plurality of aligning structures in a specific geometric distribution for a plurality of electronic components. Thus, in a single operation, a plurality of electronic components which are initially roughly arranged and aligned on a carrier can simultaneously be aligned precisely in an arrangement/pattern specified by the aligning structures.

The aligning device can be adapted to align the electronic component with the aligning structure passively and/or actively. Passive alignment takes place, for example, by means of sloping surfaces on the carrier, on which surfaces the electronic component slides to the aligning structure. Active alignment takes place, for example, by means of an inclining device and/or a vibrating device on the carrier, which devices are adapted to make the carrier move in order to bring the electronic component from a rest position on the carrier into contact with the aligning structure.

The aligning device can have an inclining device which is adapted to align the electronic component with the aligning structure. In this manner, the electronic component is aligned automatically as a result of its own weight and gravity.

In one embodiment, the aligning structure can further comprise a magnet which generates a magnetic field which exerts a magnetic force on the component, which in particular is ferromagnetic. The magnetic force can hereby act substantially in the same direction as gravity. The automatic alignment of the component can thus at least be promoted by the magnetic field that is generated or the magnetic force that is exerted.

In a variant, the aligning structure can be rotated about a first axis which runs orthogonally with respect to a broad surface of the aligning structure. In this manner, a radial force acts on the electronic component, which at least promotes the alignment of the component with the aligning structure.

For the above purpose, the inclining device can be adapted to raise and/or lower the carrier from a horizontal position at at least one point, in order to align the electronic component with the aligning structure due to the resulting inclination of the carrier. The carrier can thus be produced simply and inexpensively with a substantially flat surface on which the electronic component is able to slide towards the aligning structure.

The carrier can also be raised and/or lowered at two points in order to incline the carrier so that the electronic component can slide first towards one edge and then also towards the other edge, so that it is in contact both with the first and with the second edge of the aligning structure.

In addition to or instead of an inclining device for the carrier, the inclining device can have at least one surface which is arranged on the carrier and is sloping relative to the aligning structure. Such a surface could assist with or even completely take over the sliding movement of the electronic component relative to the aligning structure, so that the inclining device for the carrier could also be dispensed with.

The carrier can likewise have two carrier plates which are preferably located one above the other and which together define a receiver for the electronic component and are adapted to be displaced relative to one another preferably in at least one direction in order to align the electronic component with the aligning structure. Such an alignment does not require the carrier to be inclined, which reduces the space requirement for the device, and is not dependent on gravity and the own weight of the electronic component for aligning the electronic component, which is advantageous in the case of very lightweight electronic components.

The aligning device can be adapted to displace only one of the two carrier plates relative to the other carrier plate. This simplifies the construction of the device and the control of the aligning device in comparison with an aligning device which can displace both carrier plates relative to one another.

In the above embodiments, the receiver can be a through-opening in the upper carrier plate and a depression in the lower carrier plate. The electronic component can thus be surrounded securely by the carrier before the alignment in order to prevent the electronic component from sliding off the carrier before it is aligned.

The through-opening in the upper carrier plate can be larger than the depression in the lower carrier plate. The electronic component can thereby first be delivered inside at least the through-opening and on an upper side of the lower carrier plate so that it is surrounded securely by the carrier before it falls into the depression in the lower carrier plate as a result of displacement of the two carrier plates relative to one another.

Edges that are spaced apart from a base surface of the depression can thereby form the aligning structure. These edges would thus serve for reliably enclosing and precisely aligning the electronic component.

The upper carrier plate can have a larger or a smaller thickness in a cross-section than the component. The thickness is hereby to be understood as being the extent of the carrier plate, or of the component, from one broad surface to the opposite broad surface.

In one embodiment, the through-opening in the upper carrier plate can have a conical shape, in particular in a cross-section. The through-opening can hereby have a larger cross-section on the surface of the upper carrier plate facing away from the lower carrier plate than on the surface of the upper carrier plate facing towards the lower carrier plate. The through-opening can in particular be frustoconical or frustopyramidal in shape, the through-opening tapering towards the lower carrier plate. The automatic alignment of the components by gravity and/or by the magnetic force is thus promoted.

In an alternative embodiment, the receiver can be formed by an opening in the upper carrier plate, while the lower carrier plate does not have depressions.

The mentioned embodiments can be developed further in such a manner that the aligning device has a vibrating device which is adapted to align the electronic component with the aligning structure by means of vibrations of the carrier.

Such vibrations can assist the above aligning devices or, in place thereof, can have the result that the electronic component is aligned with the aligning structure, the omission of an inclining device saving space.

For this purpose, the aligning structure can be L-shaped, rectangular or square. An L-shaped aligning structure is relatively advantageous to produce since comparatively few edges and surfaces have to be manufactured precisely. A rectangular aligning structure, on the other hand, is very versatile in its uses, for example for defining four different L-shaped aligning structures, each of these four possible aligning structures being formed by two sides which meet at a right angle. A square aligning structure is moreover modeled on many electronic components of quadrangular form with a square lower side, so that quicker alignment is possible owing to the shorter distances in comparison with a non-square rectangular aligning structure.

A system for aligning an electronic component has one of the above devices for aligning an electronic component and in addition a delivery device which is adapted to deliver an electronic component at a delivery point above the device close to the aligning structure.

The system can additionally have a pick-up device which is adapted to pick up the electronic component aligned with the aligning structure in the device. Such a pick-up device can pick up the electronic component very reliably as a result of the repeated precise arrangement and alignment of an electronic component on the carrier.

A method for aligning an electronic component, which uses, for example, one of the above devices or one of the above systems, comprises the following steps:

aligning an electronic component situated on a carrier with an aligning structure by means of an aligning device, and displacing the electronic component during the alignment on the carrier by means of the aligning device so that two sides, which are at an angle to one another, of the electronic component are in contact both with a first and with a second edge of the aligning structure.

Further features, properties, advantages and possible modifications of this electrical machine will be explained by means of the following description, in which reference is made to the accompanying drawings.

The variants described herein of the system and of the device and the functional and operational aspects thereof serve merely for better understanding of their structure, functioning and properties; they do not limit the disclosure, for example, to the embodiments. The figures are partly schematic, important properties and effects in some cases being shown on a significantly enlarged scale in order to clarify the functions, active principles, technical configurations and features. Any mode of functioning, any principle, any technical configuration and any feature that is/are disclosed in the figures or in the text can be combined freely and arbitrarily with all the claims, any feature in the text and in the other figures, other modes of functioning, principles, technical configurations and features which are contained in this disclosure or follow therefrom, so that all conceivable combinations are to be assigned to the described devices. Combinations between all the individual implementations in the text, that is to say in every section of the description, in the claims, and also combinations between different variants in the text, in the claims and in the figures, are also included and can constitute subject-matter of further claims. The claims also do not limit the disclosure and thus the possible combinations of all the indicated features with one another. All the disclosed features are explicitly disclosed herein also individually and in combination with all the other features.

BRIEF DESCRIPTION OF THE DRAWINGS

FIG. 1 shows an operation of delivering electronic components onto a carrier;

FIG. 2a shows an operation of picking up electronic components already aligned on the carrier by means of a pick-up tool;

FIG. 2b shows an operation of picking up electronic components already aligned on the carrier by means of a foil substrate;

FIG. 3a is a top view of a carrier with L-shaped aligning structures according to a first embodiment;

FIG. 3b is a perspective view of part of the carrier of FIG. 3a with an electronic component aligned with the aligning structure;

FIG. 3c is a sectional side view along the sectional plane A-A shown in FIG. 3b through the carrier with part of the aligning structure and the electronic component;

FIG. 3d shows four modifications of the aligning structure of the first embodiment;

FIG. 4a is a perspective view of an initial step of the aligning operation according to the first embodiment, wherein the electronic component is in free fall onto the carrier;

FIG. 4b shows a step following FIG. 4a, wherein the electronic component is already lying with a lower side on the carrier close to the aligning structure;

FIG. 4c shows a step following FIG. 4b, wherein the carrier is inclined in order to allow the electronic component to slide towards the aligning structure;

FIG. 4d shows a step following FIG. 4c, wherein the electronic component has already been brought into contact with the aligning structure so that the alignment thereof is complete;

FIG. 5a is a top view of a carrier with L-shaped aligning structures and L-shaped aligning devices according to a second embodiment;

FIG. 5b is a perspective view of a depression of the carrier of FIG. 5a;

FIG. 5c is a sectional side view along the sectional plane B-B shown in FIG. 5b through the carrier with part of the aligning structure and part of the aligning device;

FIG. 5d shows a modification of the aligning device of the second embodiment;

FIG. 6a is a perspective view of an initial step of the aligning operation according to the second embodiment, wherein the electronic component is in free fall onto the carrier;

FIG. 6b shows a step following FIG. 6a, wherein two edges of the lower side of the electronic component are located on the sloping surfaces of the aligning device;

FIG. 6c shows a step following FIG. 6b, wherein the electronic component is aligned along the sloping surfaces against the aligning structure;

FIG. 6d shows two further modifications of the second embodiment;

FIG. 7b is a perspective view of part of the carrier of FIG. 7a;

DETAILED DESCRIPTION OF THE EMBODIMENTS

Figure 7B:
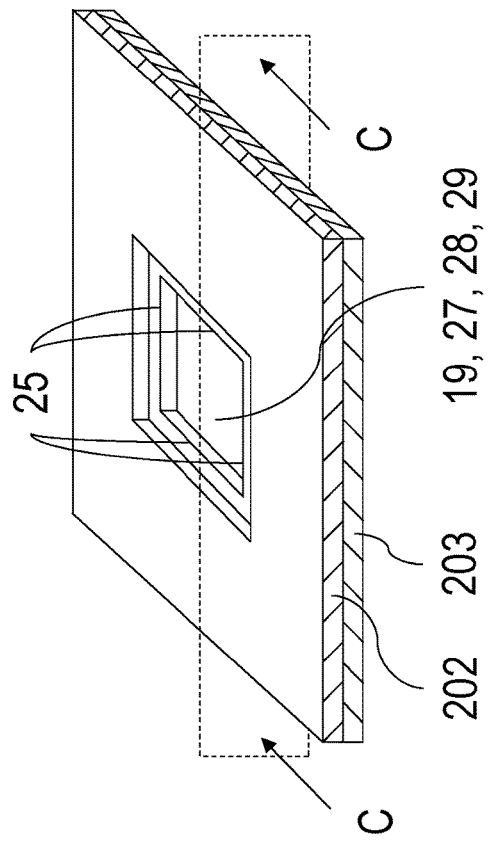

FIG. 1 shows a delivery operation/detachment process of an electronic component 1 (e.g. LED chip), which has an upper side 1a and a lower side 1b, on a carrier 2 having an upper side 2a and a lower side 2b, which in this case is an intermediate carrier. Delivery takes place by means of heat generation by a laser 3, which detaches the electronic component 1 sequentially from a wafer 4 having a plurality of electronic components 1. The electronic component 1 detached from the wafer 4 then falls, after a brief free-fall phase, with a predetermined lower side 1b onto the upper side 2a of the carrier 2. Because of the closeness of the carrier 2 to the wafer 4 at the delivery point, this free-fall phase is so short that the predetermined lower side 1b of the electronic component 1 reliably comes into contact with the upper side 2a of the carrier 2.

The electronic components 1 are thus detached by heat input from a laser 3 from a carrier foil applied to the wafer 4. The carrier foil can be a thermal release tape/foil with pressure-sensitive adhesive that releases under the effect of heat or a UV tape/foil with pressure-sensitive adhesive that releases under UV irradiation. In this manner, electronic components 1 can be detached contactlessly even from a carrier foil having a purely pressure-sensitive adhesive coating. The wafer 4 is thereby so arranged that the electronic components 1 are able to fall (freely) after they have been detached. The laser 3 is in most cases fixedly arranged in a device. Before the detachment, the electronic component 1 to be detached and the carrier 2 are aligned with the laser beam. The position of the electronic component 1 is checked visually by means of a pattern recognition system (PRS), wherein in a variant a camera looks perpendicularly at the wafer 4 and the laser 3 is coupled in via a deflecting mirror and is also arranged at the side. Alternatively, the laser 3 is arranged perpendicularly and the camera looks obliquely at the wafer 4. The wafer 4 is movably arranged. Its positioning is adjusted via the PRS.

Electronic components 1 of one type or of different types are arranged on the wafer 4. The electronic components 1 fall onto the carrier 2, which is arranged beneath the wafer 4 in place of a target substrate as is conventionally used. If the wafer 4, the laser 3 and the carrier 2 are aligned with one another, irradiation takes place. The carrier 2 can be moved continuously or step-wise as it is being equipped. In the case of continuous movement of the carrier 2, the irradiation starts before the position of the carrier tape is reached. The lead time is given by the sum of the detachment time and the falling time.

During the detachment, the device, which comprises the wafer 4, the laser 3 and the carrier 2, is in not moved, to that end two deflecting mirrors can be arranged above the wafer 4. There are also so-called galvo heads, in which there is a mirror which can be tilted. Lenses are also arranged thereafter, which lenses redirect the laser beam perpendicularly again in their diameter region despite being deflected at an angle.

FIG. 2a and FIG. 2b show two possibilities for the further processing of electronic components 1 deposited on the carrier 2. Depending on the required orientation (top/bottom) of the electronic components 1, they can be transferred simultaneously directly onto a target substrate or indirectly by being picked up by their surface and transferred to the target substrate by means of a transfer tool.

In FIG. 2a, the electronic components 1 are picked up by a pick-up device 6, that is to say a pick & place head or plunger as the transfer tool, so that they can be deposited with their lower side 1b, for example, on a target substrate and firmly bonded thereto. The transfer tool 6 is flat and picks up an electronic component 1 by suction, electrostatics or by adhesion. Its surface for holding the electronic components 1 is as large as possible in order to achieve maximum placement throughput. For example, the surface of the transfer tool 6 can correspond to the surface of the carrier 2 or of the target substrate (panel).

In FIG. 2b, the electronic components 1 are picked up by a target substrate 8 which is wetted with a bonding agent 7, so that the target substrate 8 is firmly bonded to the upper side 1a of the electronic components 1. This direct transfer can take place, for example, in such a manner that previously liquid adhesive as the bonding agent 7 is applied in the form of droplet-like adhesive deposits to the placement positions. The target substrate 8 is supplied to the carrier 2 suspended from above. The adhesive deposits 7 which are formed are capable of removing the electronic components 1 from the carrier 2 by wetting them. The electronic components 1 are sufficiently lightweight for that purpose. However, there is a risk of the carrier 2 becoming contaminated with the liquid adhesive, in particular if the electronic components 1 are located in depressions in the carrier 2. The risk of contamination can be reduced by applying silver conductive paste by screen printing as the bonding agent 7 instead of the liquid adhesive.

The transfer of electronic components 1 from the wafer 4 to the carrier 2 and the alignment of the electronic components 1 on the carrier 2 can take place at the same time as the transfer of the electronic components 1 from the carrier 2 to the target substrate 8. A plurality of carriers 2 is used for that purpose. In addition, there can be two working positions, one for the transfer of electronic components 1 and one for transfer to the substrate 8. A transport system is used for that purpose.

Alternatively, the transport paths for the carriers 2 and for the target substrates can run parallel to one another. While the equipping operation is being carried out, the subsequent detachment process on a further carrier 2 can be carried out. The transport of the preceding carrier 2 can therefore be uncoupled from the carrier 2 beneath the wafer 4.

FIGS. 3a to 8d show embodiments which serve for precisely arranging and aligning the electronic components 1 on the carrier 2. This takes place after the delivery operation in FIG. 1 and before the further processing in FIG. 2a or 2b. In this manner, a plurality of electronic components 1 can simultaneously be finely adjusted on the carrier in the pattern of the target substrate.

FIG. 3a is a top view of a carrier 2 with L-shaped aligning structures 9 according to a first embodiment. The aligning structures 9 are in the form of projections on the upper side 2a of the carrier 2 (FIG. 3b), are aligned in the same manner and are distributed in a specific arrangement/pattern on the carrier 2. For the alignment of an electronic component 1, the aligning structures 9 have a first edge 10 and a second edge 11 which are here of equal length and meet at a right angle, so that they constitute a boundary for the electronic component 1. Advantageously, an aligning structure 9 together with immediately adjacent aligning structures 9 and/or a boundary 9a in the form of a wall, for example, forms a receiver/landing zone 9b for the electronic components 1 positioned imprecisely on the carrier 2 after delivery. In this manner, the receiver/landing zone 9b is so defined that the electronic component 1 is securely enclosed before the alignment, so that alignment is possible. For this purpose, the receiver/landing zone 9b can be completely closed or can have open regions D1a, D1b. Such open regions D1a, D1b can be of different lengths, as long as the longest of the open regions is shorter than the shortest side of the electronic component 1 in order to prevent the electronic component 1 from sliding out of the receiver/landing zone 9b.

FIG. 3b is a perspective view of part of the carrier 2 of FIG. 3a with an electronic component 1 aligned with an aligning structure 9. Two sides, which are at a right angle to one another, of the electronic component 1 are thereby in contact with the two complementary edges 10, 11 of the aligning structure 9. Although the electronic component 1 here protrudes above the aligning structure 9 in a direction perpendicular to the upper side 2a of the carrier 2, it is nevertheless also possible for it to be less deep than the aligning structure 9. It is here likewise shown that the two edges 10, 11 are longer than the complementary sides of the electronic component 1, but this does not necessarily have to be the case. It is very possible that the edges 10, 11 are shorter in a direction parallel to the upper side 2a of the carrier 2 than the corresponding sides of the electronic component 1. Advantageously, that length of the edges 10, 11 is more than 50% and less than 100% of the corresponding length of the sides of the electronic component 1 that are to be brought into contact.

FIG. 3c is a sectional side view along the sectional plane A-A shown in FIG. 3b through the carrier 2 with part of the aligning structure 9 and the electronic component 1. It can be seen in this sectional view that the electronic component 1 is in contact with the edge 11 of the aligning structure 9 and that the electronic component 1 is higher than the aligning structure 9. The same contact in relation to the edge 10 of the aligning structure 9 that is not shown follows from the representation of FIG. 3b alone even without a corresponding sectional view. Of course, despite the fact that the electronic component 1 is shown in contact with a lateral surface of the aligning structure 9, a surface is not necessary. Instead, it is sufficient to provide a defined edge 11, at a distance from the lower side 2b of the carrier 2, which is capable of limiting the movement of the electronic component 1 on the carrier 2 in a direction along the upper side 2a of the carrier 2. Consequently, the cross-section through the aligning structure 9 can be rectangular, as in this case, but it can also have any other shape, as long as the described edge 10, 11 is formed.

FIG. 3d shows four modifications 9a to 9d of the aligning structure 9 of the first embodiment.

In the first modification on the outside on the left (top and bottom), the two edges 10, 11 do not meet at a right angle to one another to form a corner but are connected together by way of a curve 12. In this manner, the complex creation of a highly accurate corner is avoided in the production of the aligning structure 9a.

In the second modification in the middle on the left (top and bottom), the two edges 10, 11 merge into the curve 12 of the first modification by means of curved transition portions 13 (not shown), so that the two edges 10, 11 form a continuous edge 10, 11 as the aligning structure 9b.

In the third modification in the middle on the right (top and bottom), the aligning structure 9c is multi-part. In this case, it consists of two structures which each form one of the two edges 10, 11 and are connected together only indirectly via the carrier 2.

In the fourth modification on the outside on the right (top and bottom), instead of two edges 10, 11 which extend parallel to the upper side 2a of the carrier 2, there are provided at least three edges extending perpendicularly to the upper side 2a of the carrier 2, for example in the form of column structures 9d projecting from the carrier 2, at least two of the edges being arranged on an imaginary line parallel to the upper side 2a of the carrier 2 and at least one of the edges being arranged on an imaginary line arranged perpendicularly thereto and parallel to the upper side 2a of the carrier 2, so that the at least three edges of the column structures 9d form an L-shape. Of course, the reverse arrangement is also possible.

FIGS. 4a to 4d show an aligning method according to the first embodiment.

In FIG. 4a, the electronic component 1 is in free fall onto the carrier 2, so that it is finally in contact with the carrier 2 at least roughly close to an aligning structure 9, preferably in a defined receiver or landing zone.

In FIG. 4b, the electronic component 1 is already lying with its lower side 1b on the upper side 2a of the carrier 2 at a distance from the aligning structure 9 and within the receiver or landing zone.

In FIG. 4c, the carrier 2 is inclined so that the electronic component 1 is able to slide towards the aligning structure 9. This inclination of the carrier 2 can be present from the outset or can only be effected once the electronic component 1 has come into contact with the carrier 2 or has come to rest thereon. For this purpose, an inclining device 14 is provided, which is able passively to hold the carrier 2 raised at least at one point or actively to raise and lower the carrier. The carrier 2 is here raised by a distance D. The required distance is dependent, for example, on the coefficient of friction between the electronic component 1 and the carrier 2 and also on the weight of the electronic component 1 and the size of the carrier 2. In the present case, in which the carrier 2 is actively raised by means of the inclining device 14 at only one point of the carrier 2, this raising has the effect that the electronic component 1 slides in the direction towards the corner formed by the two edges 10, 11. It can likewise be provided that the carrier 2 can be raised and/or lowered at at least two points in order to incline the carrier 2 so that the electronic component 1 is able to slide first towards one edge 10 and then also towards the other edge 11, so that it is in contact both with the first and with the second edge 10, 11 of the aligning structure 9.

In FIG. 4d, the electronic component 1 is already in contact with the aligning structure 9, so that the alignment thereof is complete, following which the carrier 2 is lowered into its horizontal starting state again by means of the inclining device 14.

FIG. 5a is a top view of an upper side 102a of a carrier 102 with L-shaped aligning structures 15, 16 and L-shaped aligning devices 17, 18 according to a second embodiment. The aligning structures 15, 16 and aligning devices 17, 18 are part of a receiver 19 in the form of a depression in the carrier 2. The aligning devices 17, 18 are surfaces which slope downwards from the upper side 102a of the carrier 102 to the respective aligning structure 15, 16. The receiver 19 thus becomes smaller to its base surface 20, which corresponds at least to the base surface, that is to say the surface of the lower side 1b, of the electronic component 1 to be aligned. The initial surface of the receiver 19, which extends in a plane with the upper side 102a of the carrier 102, is of such a size that an electronic component 1 that falls imprecisely onto the carrier 102 still lands wholly within the receiver 19 even though it is not immediately aligned with the aligning structure 15, 16.

FIG. 5b is a perspective view of the receiver 19 of the carrier 102 of FIG. 5a. The aligning structure 15, 16 in the form of edges 15, 16 is located opposite the aligning device in the form of sloping surfaces 17, 18.

FIG. 5c is a sectional side view along the sectional plane B-B shown in FIG. 5b through the carrier 102 with part of the aligning structure 17 and part of the aligning device 16. The sloping surface 17 of the aligning structure can in particular be seen here. In addition, a dimension of the base surface 20 of the receiver 19 parallel to the upper side 102a of the carrier 102 is to be seen.

FIG. 5d shows a modification of the aligning devices 17, 18 of the second embodiment. Although this relates to the aligning device 17, 18, it corresponds analogously to the first modification, shown in FIG. 3d, of the first embodiment. The two sloping surfaces 17, 18 here do not meet at an angle to one another in order to form a sloping corner, but are connected together via a curve 21.

The remaining modifications from FIG. 3d of the first embodiment can likewise readily be applied to this second embodiment.

FIGS. 6a to 6d show an aligning method according to the second embodiment.

In FIG. 6a, the electronic component 1 is in free fall onto the carrier 102, so that it lands within the receiver 19.

In FIG. 6b, the electronic component 1 has landed in the receiver 19 so that two edges of the lower side 1b of the electronic component 1 lie on the sloping surfaces 15, 16 of the aligning device 17, 18. The electronic component 1 slides under the effect of gravity along those sloping surfaces 17, 18 and into the receiver 19, so that its lower side 1b lies on the base surface 20 of the receiver 19.

In FIG. 6c, the electronic component 1 has already slid along the sloping surfaces 17, 18 towards the aligning structure 15, 16 and come into contact therewith, so that it is now aligned.

FIG. 6d shows two further modifications of the second embodiment.

In the first modification, the sloping surfaces 17, 18 of the aligning device are subdivided, starting at the upper side 102a of the carrier 102, into a sloping surface 17, 18 and an adjacent perpendicular surface 22, 23 which extends to the base surface 20 of the receiver 19.

The second modification is a vibrating device 24. By means of the vibrating device, the carrier 102 can be made to vibrate, the vibrations being such that the alignment of the electronic component 1 is assisted, for example in the event that the electrical component is tilted inside the receiver 19 or in the event that the weight of the electronic component 1 is insufficient to ensure that the electronic component slides fully along the sloping surfaces 17, 18 of the aligning device 17, 18.

Figure 7A:
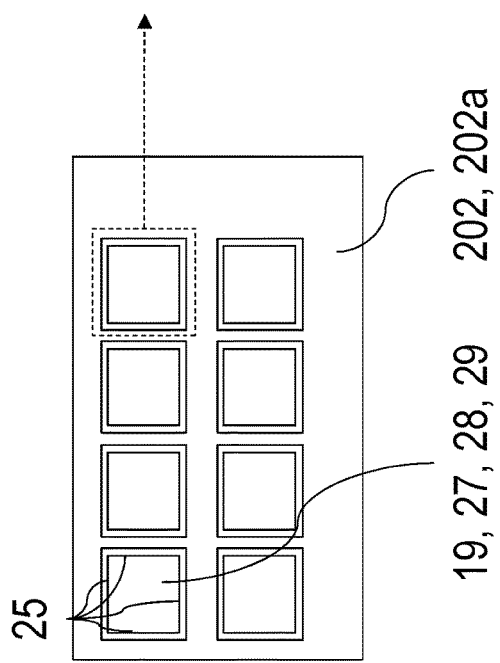
FIG. 7a is a top view of a two-part carrier with aligning structures according to a third embodiment.

FIG. 7a is a top view of an upper side 202a of a two-part carrier 202, 203 (FIG. 7b) with L-shaped, rectangular or square aligning structures 25 according to a third embodiment. Two opposing carrier plates 202, 203 define the carrier 202, 203, which has a receiver 19 in the form of a depression for an electronic component 1. The upper carrier plate 202 has a through-opening 27, the area of which in the plane of the upper side 202a of the upper carrier plate 202 is such that it is larger than the area of the lower side 1b of the electronic component 1 to be aligned. The through-opening 27 further leads to a depression 28 in the lower carrier plate 203, the depression having a base surface 29 on which the electronic component 1 can lie and which has an area which is at least as great as the lower side 1b of the electronic component 1 to be aligned and is smaller than the area of the through-opening 27 which lies in a plane with the upper side 202a of the upper carrier plate 202.

FIG. 7b is a perspective view of part of the carrier of FIG. 7a. The figure shows not only the two carrier plates 202, 203, which lie directly on top of one another, but also the through-opening 27, the depression 28 and the base surface 29, which form the receiver 19.

Figure 7C:
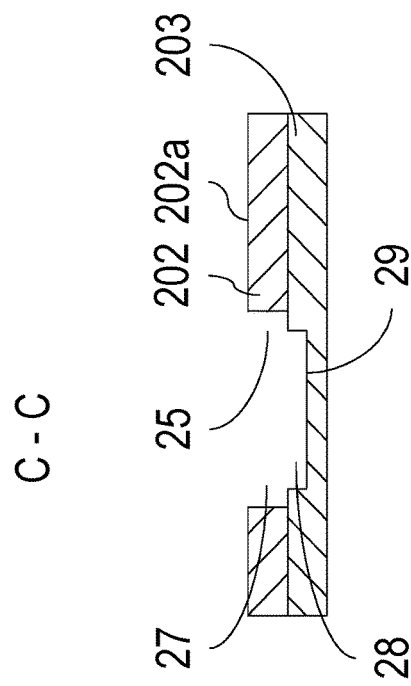
FIG. 7c is a sectional side view along the sectional plane C-C shown in FIG. 7b through the carrier with part of the aligning structure.

FIG. 7c is a sectional side view along the sectional plane C-C shown in FIG. 7b through the carrier 202, 203 with part of the aligning structure 25, which is in the form of an edge 25. The figure shows in particular the through-opening 27, the depression 28 and the base surface 29, which form the receiver 19.

Figure 7E:
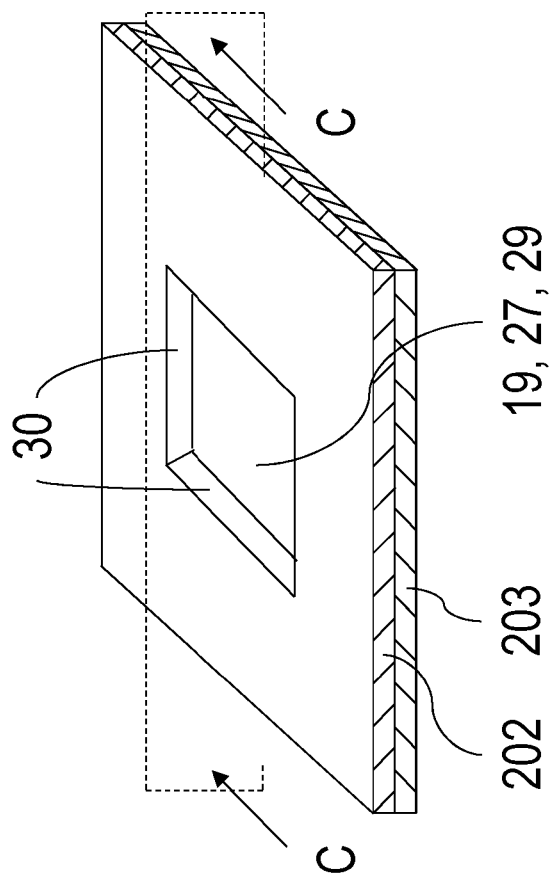
FIG. 7e is a perspective view of part of the carrier of FIG. 7d.
Figure 7D:
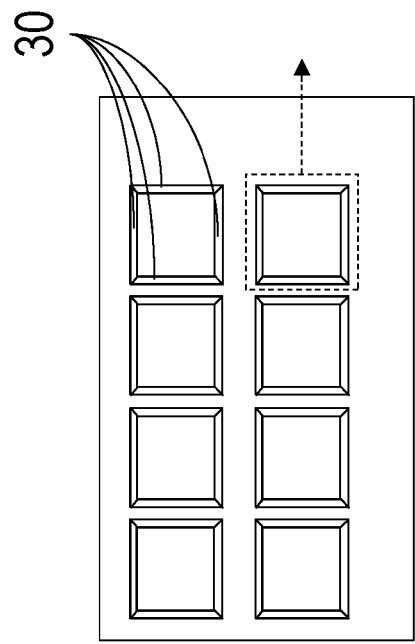
FIG. 7d shows a modification of the third embodiment.

FIG. 7d shows a modification of the third embodiment. The transition from the through-opening 27 of the upper carrier plate 202 to the lower carrier plate 203 is here not stepped but is in each case replaced by a sloping surface 30, which each corresponds to the sloping surfaces 17, 18 from the second embodiment. As a result of these sloping surfaces 30, the receiver has a frustopyramidal shape overall. The lower carrier plate 203 in this embodiment does not have any depressions, so that the base surface 29, on which the component 1 can lie, is defined by the through-opening 27 or by the sloping surfaces 30. The base surface 29 thus forms a flat contact surface for the component.

In a further development (not shown), the through-opening can be formed by a combination of sloping surfaces and steps. In particular, sloping surfaces which are arranged on the upper side of the carrier can here form a first part of the through-opening. Perpendicular surfaces adjacent to the sloping surfaces and extending to the base surface can form a second part of the through-opening, analogously, for example, to the surfaces 22 and 23 shown in FIG. 6d.

FIG. 7e is a perspective view of part of the modified carrier of FIG. 7d. The figure shows not only the two carrier plates 202, 203, which rest directly on one another, but also the through-opening 27 with the sloping surfaces 30, which forms the receiver.

Figure 7G:
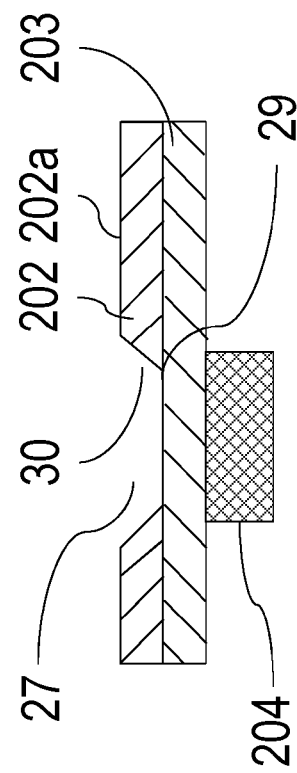
FIG. 7g shows a further development of the modification of the third embodiment, which has a magnet.
Figure 7F:
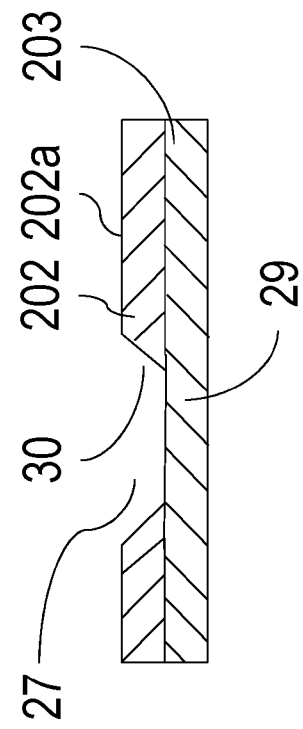
FIG. 7f is a sectional side view along the sectional plane C-C shown in FIG. 7e through the carrier with part of the modified aligning structure.

FIG. 7f is a sectional side view along the sectional plane C-C shown in FIG. 7e through the modified carrier 202, 203 with the sloping surfaces 30, which serve as the aligning structure in the modification of the third embodiment. The figure shows in particular the through-opening 27 and the base surface 29, which form the receiver.

FIG. 7g shows a further development of the modification of the third embodiment. A magnet 204 is arranged on the side of the lower carrier plate 203 facing away from the through-opening 27. The magnet 204 generates a magnetic field, which exerts a magnetic force on the electronic component 1, which in particular is ferromagnetic. Alignment of the ferromagnetic electronic component 1 with the aligning structure is thereby promoted.

FIGS. 8a to 8d show an aligning method according to the third embodiment.

Figure 8A:
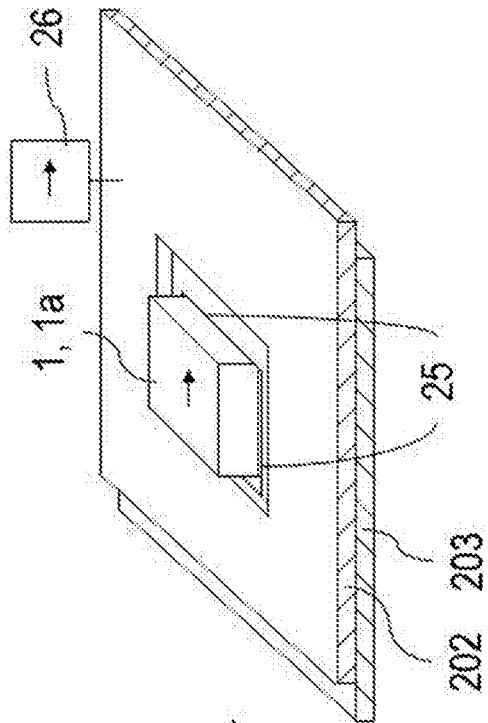
FIG. 8a is a perspective view of an initial step of the aligning operation according to the third embodiment, wherein the electronic component is in free fall onto the carrier.

In FIG. 8a, the electronic component 1 is in free fall onto the carrier 202, 203, so that it lands within the receiver 19.

Figure 8B:
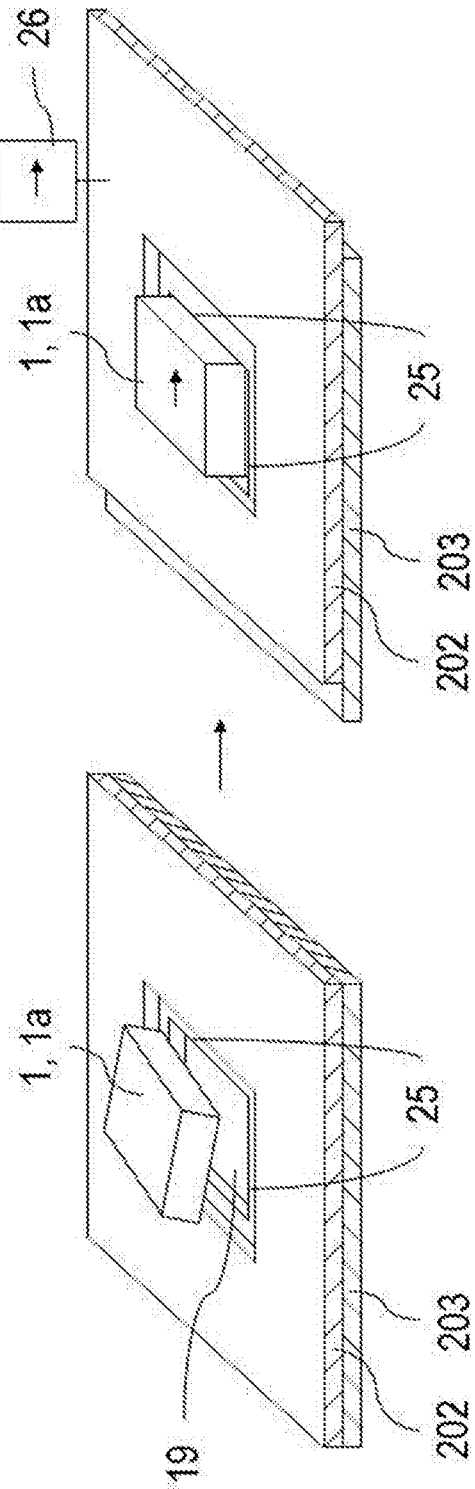
FIG. 8b shows a step following FIG. 8a, wherein the electronic component is lying with a lower side on the carrier and is aligned by means of an upper carrier plate with a first edge of a lower carrier plate.

In FIG. 8b, the electronic component 1 is lying with the lower side 1b on the base surface 29 of the lower carrier plate 203. By means of an aligning device 26, which displaces the upper carrier plate 202 along the lower carrier plate 203 in the direction towards a first edge 25 of the aligning structure 25, the electronic component 1 is first aligned with the first edge 25.

Figure 8C:
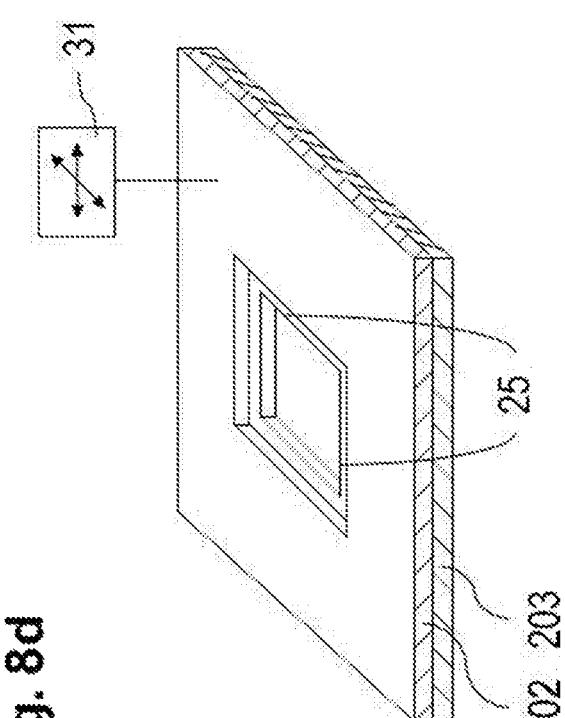
FIG. 8c shows a step following FIG. 8b, wherein the electronic component is additionally aligned by means of the upper carrier plate with a second edge of the lower carrier plate.

In FIG. 8c, the electronic component 1 is then brought into contact with a second edge 25 of the aligning structure 25 by means of the aligning device 26, by displacement of the upper carrier plate 202 additionally along the lower carrier plate 203 in the direction towards the second edge 25 further edge.

Figure 8D:
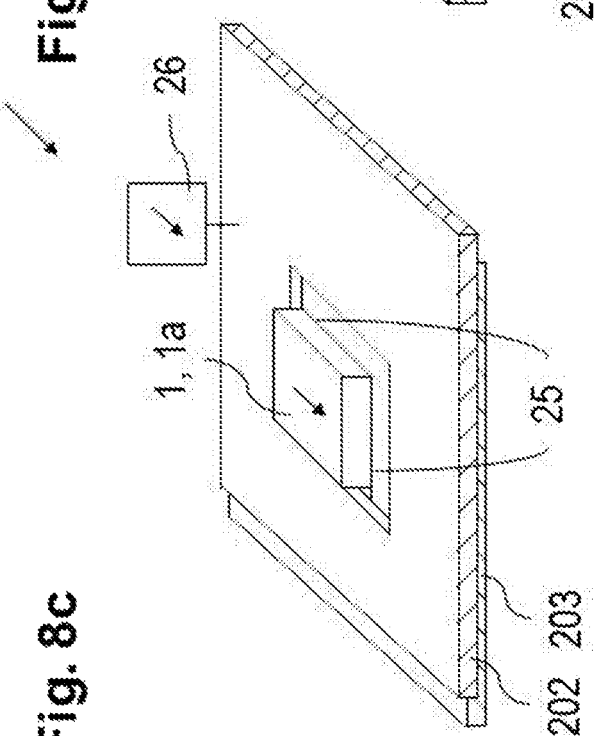
FIG. 8d shows a further modification of the third embodiment, in which the alignment of the electronic component additionally takes place by means of a vibrating device.

FIG. 8d shows a further modification of the third embodiment, in which the alignment of the electronic component 1 additionally takes place by means of a vibrating device 31 which functions similarly to the vibrating device 24 of the second embodiment. The vibrating device 24 ensures that the electronic component 1 does not tilt inside the receiver 19 and lands wholly on the base surface 29.

It will be seen from the third embodiment that only an L-shaped aligning structure 25 is used, which is formed in the lower carrier plate 203 by the lower and right-hand edge 25. Any other combination of two edges 25 which are at an angle to one another can likewise also be used. In the present case, four possible aligning structures 25 are thus obtained. If, for example, the lower carrier plate 203 is also movable relative to the upper carrier plate 202 by means of the aligning device 26, then 8 L-shaped aligning structures are obtained, since an electronic component 1 situated in the receiver 19 can also be aligned with the edges of the upper carrier plate 202. In this manner, different electronic components 1 can be aligned with a carrier 202, 203.

A modification of the third embodiment consists in providing a multi-part carrier 202, 203 in which the carrier plates 202, 203 are arranged not (only) one above the other but (also) in a plane next to one another. These carrier plates can be displaced towards one another and away from one another along a base surface 20 in order to define between them a variable receiver 19, similar to the second embodiment. The mutual displacement at the same time leads to an alignment of the electronic component 1 inside the receiver 19. In this manner, the height of the carrier 202, 203 can be reduced and/or a more variable receiver 19 which can better be adapted to different sizes of electronic components 1 can be created.

The distribution of connectors of the electronic component 1 aligned on the carrier 2, 102, 202, 203 is to correspond in the above embodiments, taking account of the type of further processing according to FIG. 2a or FIG. 2b, to the geometric distribution of complementary connecting contacts on a target substrate that is provided. The same applies to a plurality of aligned electronic components 1.

The invention claimed is:

1. A system for aligning an electronic component having:
   a device for aligning the electronic component having:
      a carrier with an aligning structure for an electronic component, and
      an aligning device for aligning the electronic component with the aligning structure, wherein the aligning structure defines a first and a second edge which are at an angle to one another and are complementary to two sides, which are at the same angle to one another, of the electronic component to be aligned, wherein
      the aligning device is configured to align the electronic component with the aligning structure by bringing sides of the electronic component into contact both with the first and with the second edges of the aligning structure; and
   a delivery device which is configured to deliver the electronic component at a delivery point above the device for aligning the electronic component close to the aligning structure; and
   a pick-up device which is configured to pick up the electronic component aligned with the aligning structure in the device, wherein
      (i) the delivery device is a laser which is configured to detach the electronic component from a carrier foil applied to a wafer by means of heat generation, wherein the carrier is a foil with pressure-sensitive adhesive that releases under an action of heat or a foil with pressure-sensitive adhesive that releases under UV irradiation;
      (i) the delivery point is spaced apart from the carrier in such a manner that the electronic component is able to fall freely between them; and
      (iii) the pick-up device is a transfer tool which is configured to pick up the aligned electronic component temporarily, or
      (iv) the pick-up device is a substrate which is configured to pick up the aligned electronic component permanently, wherein liquid adhesive is provided on the substrate as a bonding agent.

2. The system as claimed in claim 1, wherein the carrier has a plurality of aligning structures in a specific geometric distribution for a plurality of electronic components to be aligned, wherein the aligning device is adapted to align the electronic component with the aligning structure passively and/or actively.

3. The system as claimed in claim 1, wherein the aligning device has an inclining device which is adapted to align the electronic component with the aligning structure, wherein
   (i) the inclining device is configured to raise and/or lower the carrier from a horizontal position at at least one point, in order to align the electronic component with the aligning structure as a result of the inclination, and/or
   (ii) the aligning device has at least one surface which is arranged on the carrier and is sloping relative to the aligning structure.

4. The system as claimed in claim 1, wherein the carrier has two carrier plates which are located one above the other and which together define a receiver for the electronic component and are adapted to be displaced relative to one another in at least one direction in order to align the electronic component with the aligning structure.

5. The system as claimed in claim 4, wherein the receiver for the electronic component defined by the two carrier plates which are arranged one above the other has a conical shape, in particular a frustoconical shape or a frustopyramidal shape, with a flat contact surface.

6. The system as claimed in claim 1, wherein
   (i) the aligning device has a vibrating device which is configured to align the electronic component with the aligning structure by means of vibrations of the carrier, and/or
   (ii) the aligning structure is L-shaped, rectangular or square.

7. The system as claimed in claim 1, wherein the aligning device has a magnet which is arranged and configured to generate a magnetic field which exerts a magnetic force on the electronic component, which is ferromagnetic, which at least promotes the alignment of the electronic component with the aligning structure.

8. The system as claimed in claim 1, wherein the delivery point is spaced apart from the carrier in such a manner that the electronic component is able to fall freely between them, and/or silver conductive paste is provided as the liquid adhesive by screen printing.

9. A method for aligning an electronic component, which method uses the system as claimed in claim 1, comprising the steps:
   delivering the electronic component at the delivery point above the device for alignment close to the aligning structure;
   landing of the at least one electronic component, after a free-fall phase, inside a receiver on an upper side of the carrier,
   aligning the electronic component situated on the carrier with the aligning structure by means of an aligning device, wherein the aligning structure defines the first and second edges which are at an angle to one another and are complementary to two sides, which are at the same angle to one another, of the electronic component to be aligned;
   bringing sides of the electronic component into contact both with the first and with the second edges of the aligning structure in order to align the electronic component with the aligning structure;
   displacing the electronic component during the alignment on the carrier by means of the aligning device so that two sides, which are at an angle to one another, of the electronic component are in contact both with the first and second edges of the aligning structure;
   picking up the electronic component aligned with the aligning structure in the device in a pick-up device, wherein the pick-up device is the transfer tool which is configured to pick up the aligned electronic component temporarily, or the pick-up device is the substrate which is configured to pick up the aligned electronic component permanently, wherein liquid adhesive is used as the bonding agent on the substrate.

* * * * *